US006815955B1

(12) United States Patent
O'Neal, III

(10) Patent No.: US 6,815,955 B1
(45) Date of Patent: Nov. 9, 2004

(54) CIRCUIT AND CIRCUIT BREAKER TESTER

(75) Inventor: Charles D. O'Neal, III, Bolton, MA (US)

(73) Assignee: K.O. Devices, Inc., Berlin, MA (US)

( * ) Notice: Subject to any disclaimer, the term of this patent is extended or adjusted under 35 U.S.C. 154(b) by 0 days.

(21) Appl. No.: 10/021,336

(22) Filed: Dec. 12, 2001

(51) Int. Cl.$^7$ ............................................. G01R 31/00
(52) U.S. Cl. ................................................... 324/424
(58) Field of Search .................. 324/424, 127, 324/158.1; 307/126; 73/866, 73; 361/42

(56) References Cited

U.S. PATENT DOCUMENTS

| | | | |
|---|---|---|---|
| 5,700,961 A | * 12/1997 | Anthony et al. | ............... 73/866 |
| 5,736,861 A | 4/1998 | Keleher et al. | ............. 324/424 |
| 6,049,143 A | * 4/2000 | Simpson et al. | ............ 307/126 |
| 6,191,589 B1 | * 2/2001 | Clunn | ........................ 324/424 |

* cited by examiner

*Primary Examiner*—N. Le
*Assistant Examiner*—Donald M Lair
(74) *Attorney, Agent, or Firm*—Brian M. Dingman, Esq.; Mirick, O'Connell, DeMallie & Lougee, LLP

(57) ABSTRACT

A circuit breaker test device for testing a circuit breaker, and also for testing the branch circuit of which the circuit breaker is a part. The circuit breaker test device includes a switch that controllably short-circuits the branch circuit. A controller causes the switch to short circuit the branch circuit. A timer, responsive to operation of the controller, causes the switch to cease short-circuiting the branch circuit after a particular test time. An impedance value of the branch circuit is determined. The controller is enabled only if the impedance value is within predetermined limits. The timer is capable of establishing a variable test time.

7 Claims, 1 Drawing Sheet

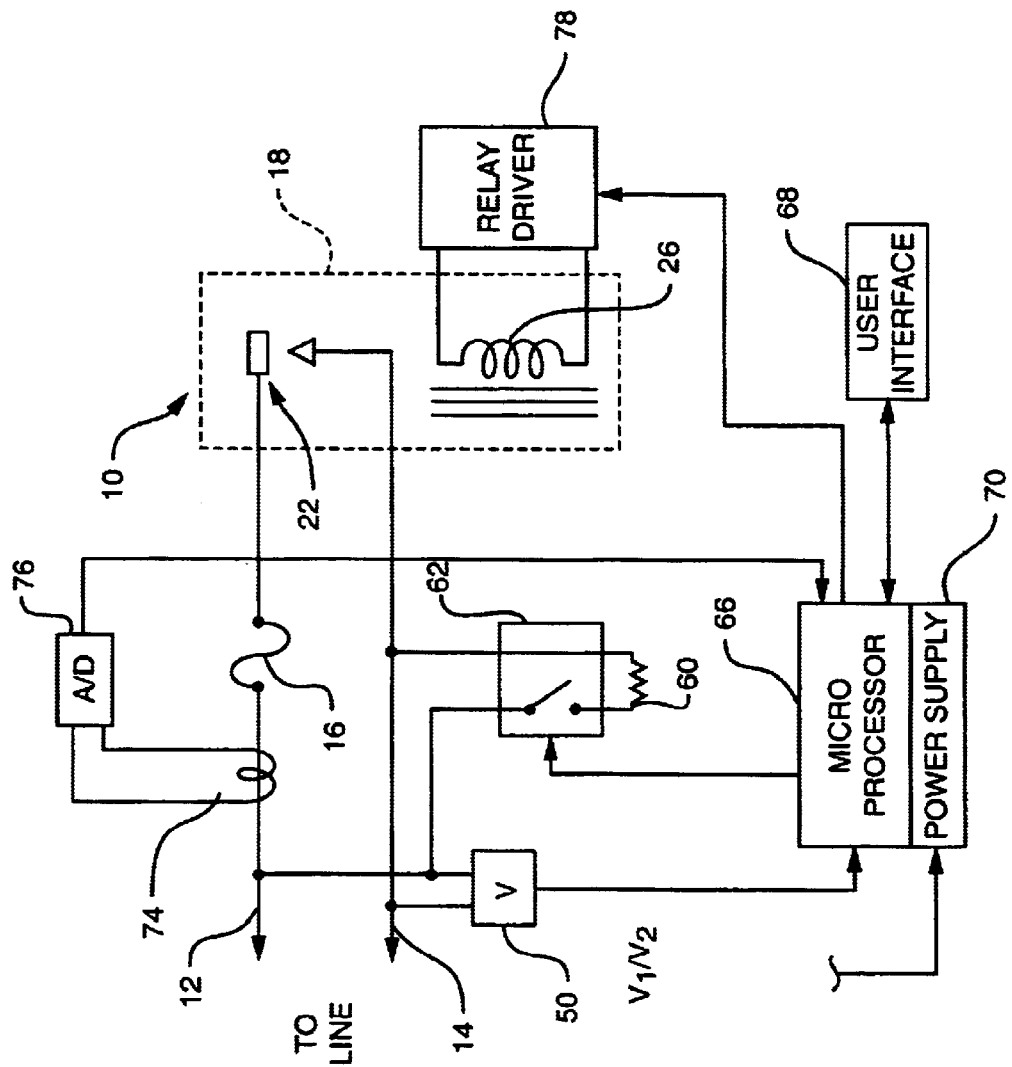

CIRCUIT AND CIRCUIT BREAKER TESTER

FIELD OF THE INVENTION

This invention relates to a device for testing circuits and circuit breakers.

BACKGROUND OF THE INVENTION

The device disclosed in U.S. Pat. No. 5,736,861 is useful. However, several additional features would help with the functionality of the device.

SUMMARY OF THE INVENTION

Accordingly, this invention features several improvements to the circuit tester disclosed in U.S. Pat. No. 5,736,861, the disclosure of which is incorporated herein by reference.

One improvement is to control the branch circuit shorting time based on the branch impedance. The impedance measurement is made as described in the patent, column 3, lines 25–67. The shorting time referenced in the '861 patent in column 2, lines 63–67, is 0.1 to 10 seconds. This is a predetermined, fixed time, established by the RC circuit values. The improvement of this aspect of the invention is to make the shorting test time proportional to the measured branch impedance. The proportionality can be linear, or established though some other arithmetic algorithm. If the impedance is low, then the test time is short. If the impedance is higher, then the test time is longer. The variable shorting test time is under control of microprocessor 66.

The variable test time would preferably be implemented in the firmware contained in memory serving the microprocessor. The firmware would take the branch impedance measured in the pre qualification test ('861 patent, column 3 lines 25–32). If the branch impedance was within certain upper and lower limits, a shorting time would be calculated from either an algorithm like a simple, linear or exponential proportionality, or a look up table contained in the firmware. The hardware remains the same as defined in the '861 patent.

The second improvement herein contemplates the measurement of any change in current flow during the shorting test. Since a change in current flow may be caused by a fault in the branch circuit, if the current changes too rapidly, the breaker test may be aborted. An acceptable change in current (thus energy dissipated, which causes a temperature change in the circuit) can be predicted from the circuit configuration (e.g., measured branch impedance). Measurements outside of an acceptable current flow window may indicate a defective circuit.

In order to implement this aspect of the invention, a current sensing transformer 74 is added to the test device disclosed in the '861 patent. An analog to digital converter 76 would also be added to convert the measured analog current output from the sensor to a digital data stream for the microprocessor. The current sensing transformer can be accomplished by using the existing wire going to the fuse in the '861 patent as the primary wire, with the transformer secondary accomplished with one or more turns, terminated by the A/D converter. The digital signal from the A/D converter would be examined by the firmware in the microprocessor many times during the shorting period. If there was a drop in sampled current in excess of a predetermined amount, then the test would be aborted, for example by the microprocessor causing the relay to de-energize, and an error signal would be sent to the user interface.

The third improvement herein contemplates the use of arc detection added to the breaker tester. The arc detection can be used to qualify a circuit prior to the shorting test. Also, once the circuit is qualified, arc detection can be used to monitor the circuit for any arcing during the shorting test. In the '861 patent, there is already a voltage sensor 50. With the current flow concept described above, a current sensor 74 is added. These two items comprise the additional hardware needed to accomplish arc detection. For arc detection, the current sensor and the voltage sensor both need to be "high speed", in that they must be able to detect voltage and current variations that happen quickly. As an example, the detection should take place at a bandwidth of least 500 KHz in order to capture the frequencies associated with arc signatures. Other than the addition of "high speed" current and voltage sensing as described, the hardware is unchanged and the arc detection is accomplished in the firmware.

A simple method to accomplish arc detection would be to sample both the voltage and current sensors, and if significant energy above the fundamental power line frequency (60 Hz in the US) was detected, then the test would either not be performed (if in the qualification phase), or, if in the test phase, the test would be aborted. The firmware would determine the ratio of fundamental power line energy to high frequency energy, which is indicative of arcing. The ratio would be determined preferably using preset limits stored in the processor memory. Alternatively, arc detection can be accomplished by comparing the waveshape, or measurements of the waveshape, to a stored library of known arc signatures. This would also be done in the firmware of the microprocessor.

This invention features in one embodiment an improved circuit breaker test device for testing a circuit breaker and the branch circuit of which the circuit breaker is a part, the circuit breaker test device comprising first switch means for controllably short circuiting the branch circuit; control means for causing the first switch means to short circuit the branch circuit; timer means, responsive to operation of the control means, for causing the first switch means to cease short circuiting the branch circuit after a test time; and test means for determining an impedance value of the branch circuit, and enabling operation of the control means only if the impedance value is within predetermined limits, the improvement comprising the timer means capable of establishing a variable test time. The test time may be established to be proportional to the determined impedance value of the branch circuit. The test time may be established in order to maintain a constant energy carried by the branch circuit during the short circuit test.

Also featured is an improved circuit breaker test device for testing a circuit breaker and the branch circuit of which the circuit breaker is a part, the circuit breaker test device comprising first switch means for controllably short circuiting the branch circuit; control means for causing the first switch means to short circuit the branch circuit; timer means, responsive to operation of the control means, for causing the first switch means to cease short circuiting the branch circuit after a test time; and test means for determining an impedance value of the branch circuit, and enabling operation of the control means only if the impedance value is within predetermined limits, the improvement comprising means for measuring the current flowing in the branch circuit during the short circuit test.

The improved circuit breaker test device of this same embodiment may further comprise means, responsive to the means for measuring current, for disabling operation of the control means upon measurement of a predetermined change in the measured current. The predetermined change may be a drop in the current in excess of a predetermined amount.

The improved circuit breaker test device may in this same embodiment still further comprise means for measuring the voltage in the branch circuit. The improved circuit breaker test device of this same embodiment may further comprise means for detecting arcing in the branch circuit. The means for detecting arcing may then comprise means, responsive to the means for measuring current and the means for measuring voltage, for detecting energy above the fundamental frequency. The means for detecting arcing may further comprise means for determining the ratio of energy at the fundamental frequency to energy above the fundamental frequency.

BRIEF DESCRIPTION OF THE DRAWING

The figure is a schematic diagram of the preferred circuit for accomplishing all of the improvements contemplated herein, the figure depicting modifications to FIG. 2 of U.S. Pat. No. 5,736,861.

DESCRIPTION OF THE PREFERRED EMBODIMENT

The improvements will be described in reference to accompanying FIG. 1. The figure is a modification of FIG. 2 of the U.S. Pat. No. 5,736,861 patent which discloses that tester 10 includes probes 12 and 14, fuse 16, relay 18, known load resistance 60, switch 62 and power supply 70. The modifications will become clear through the explanations below. In summary, the RC circuit in the patent is now replaced with microprocessor functionality. User interface 68 contains the "push-to-test" switch, and switch 64 is eliminated. Relay driver 78 is now used to operate solenoid 26, which operates normally open switch 22. A current sensor 74 and associated A/D converter 76 has been added.

The several preferred embodiments are now described in detail.

Design Considerations for Controlled Shorting Interval

The branch circuit breaker tester disclosed in the '861 patent provides a time controlled "short" to the branch circuit under test, wherein the length of the shorting interval may be fixed. This fixed interval may not be optimum, because typical branch circuit impedances vary over a wide range. The resulting energy dissipation in the branch circuit under test and desired breaker trip time will vary as well.

The preferred algorithm to accomplish a variable test time is a constant energy approach. This approach eliminates the possibility of excess heating of the branch circuit during the shorting test. For example, if the branch impedance was 0.12 ohm, then the test time would be 0.1 seconds for a certain energy dissipated during the test. However, if the branch impedance was 0.6 ohm, then the test time that resulted in the same energy dissipation would be 2.5 seconds.

The following is a calculation of branch circuit impedance: Let R1=Branch circuit resistance–the variable. R2=Resistance of 20 A load. VI=Voltage drop due to 20 A load. V2=Available voltage with 20 A load. Assume source voltage of 120 V RMS.

For a branch circuit with a 10% voltage drop, V2=0.9× 120V, or 108V.
Therefore, for the complete circuit:

$$108 = (R2/(R1+R2)) \times 120$$

and $$20 = 120/(R1+R2)$$

Leads to the following calculation:

$$20 = 120/(R1+R2)$$

$$20R1 + 20R2 = 120$$

$$R1 + R2 = 6$$

$$R1 = 6 - R2$$

$$108 = (R2/(R1+R2)) \times 120$$

Substituting for R1, where R1=6−R2, gives:

$$108 = (R2/(6-R2+R2)) \times 120$$

$$108 = (R2/6) \times 120$$

$$648 = R2 \times 120$$

Therefore, R2=5.4 ohms
And R1=6−5.4, or 0.6 ohms.

Thus, a branch circuit that has a 10% voltage drop has an impedance of 0.6 ohms. Since this is a linear circuit, all values will scale proportionately. This means that the branch impedance can be determined from the voltage drop. For example, a 5% drop will correspond to a 400 A fault current in a 120V branch circuit with a branch impedance of 0.3 ohms.

This establishes that a branch circuit can be qualified prior to subjecting it to the short test by measuring its impedance. For circuit breaker testing in 15 and 20 Amp, 120 Volt branch circuits, the breaker needs to be tested with a fault current between 100 Amperes and 1000 Amperes. This "window" corresponds to branch impedances of 0.12 ohms to 1.2 ohms. A maximum branch impedance has to be specified in order to provide a valid test at the low current end. Also, a minimum impedance has to be specified so that the fault current does not exceed 1000 A. This would mean a branch circuit with a voltage drop under 2% (impedance under 0.12 ohm) would be blocked from being tested.

If the branch circuit has passed the above branch impedance pre qualification, then a proportionally controlled shorting interval is employed. This interval is determined by the maximum allowable temperature rise, and will limit the total energy dissipation in case the breaker doesn't trip. The shorting interval is controlled by microprocessor 66.

An example of a calculation of the temperature rise associated with the shorting interval follows. The final results can be scaled to predict other shorting time intervals.

Assuming the following to be tested: #14 copper used as the cable conductor size; 2% voltage drop, corresponding to a 1000 A current; a 0.1 second shorting interval. #14 wire has a resistance of 2.52 ohms/1000 feet or 0.00252 ohms/ft. With 1000 A RMS current, the dissipation in one foot is:

$$P = I \text{ (squared)} \times R, \text{ or}$$

$$P = 1000 \times 1000 \times .00252 = 2{,}520 \text{ watts}$$

The temperature rise calculation is as follows: #14 Cu has a cross-sectional area of 0.00323 square inches, and for a one-foot length, the volume of copper is 0.00323×12, or 0.0388 cu in. 1 cubic in=16.39 cubic cm. 0.0388×16.39= 0.636 cubic cm of copper in 1 foot of #14 wire. The density of copper is 8.96 g/cc. Therefore, the mass of copper in one foot of #14 wire is 0.636×8.96, or 5.69 g. The atomic wt. of Cu=63.54 (63.54 g/mole). Therefore, the amount of copper in one foot of #14 wire is 5.69/63.54, or 0.09 mole.

1 watt=0.239 cal/sec. For a dissipation of 2,520 watts, the heat delivered is 0.239×2520=602 cal/sec, or about 60 cal in a 1/10th second interval.

The molar heat capacity of copper (Cu)=5.85 cal/mole° C. The heat capacity of one foot of #14 copper wire is thus 0.09×5.85=0.526 cal/° C. Since the heat delivered is 60 cal, the temperature rise for the 0.09 mole of Cu in the foot of wire is 60/0.526=114° C. Thus, a #14 wire carrying 1000 A RMS will heat to 134° C. (+20° C. ambient added) in 1/10th second.

This temperature rise can be scaled, being proportional to time and proportional to the square of current. Consequently, the desired shorting interval for a constant temperature rise is proportional to the square of branch impedance. These currents and tripping times fall within most breaker manufacturer's specifications.

In reality, these theoretical temperatures will never be met due to additional thermal conductivity presented by the insulation, air, and any surfaces the wire is in contact with. The actual numbers will be lower. If the breaker trips in the predetermined windowing interval, then the circuit is being protected by the breaker, to limit wire temperature rises such that they will be safe in the event of a short circuit.

Design Considerations for the "Droop" Test:

Another inventive improvement is to monitor the value of the short circuit current during the shorting test, and abort the test if the current drops too rapidly. If the current drops at a rate greater than what is created by normal heating of the conductors, a "hot spot" may have been generated during the test due to an existing fault in the wiring. This hot spot, being localized in nature, will heat very fast, and increase the circuit impedance. The abnormal impedance increase will create an abnormal drop in the short circuit current. Detection of this current drop can be implemented with a microprocessor-based product with a sufficiently fast sampling rate, preferably one that could accomplish millisecond-based comparisons. Current sensor 74 and A/D converter 76 provide current measurement to microprocessor 66.

As has been shown, there is a very predictable temperature rise associated with the current flow within the shorting interval. This temperature rise will increase the resistivity of the copper, resulting in a predictable and continuous drop in current for the duration of the breaker test in a normal circuit. An example is below.

The temperature coefficient for copper is 0.0039/° C. For a 114° C. rise in temperature, the resistance of copper will increase by the amount calculated below:

$$R/Ro=(1+a(T-To)), \text{ where}$$

R=the resulting resistance
Ro=the initial resistance
a=0.0039/° C.
T=the final temperature
To=the initial temperature In this example, R/Ro=(1+0.0039(114). R/Ro=1+0.45. R/Ro=1.45.

This means that with the constant temperature rise interval selected based upon branch impedance, the resistance will increase 45% during the complete test interval. This resistance change can be measured as a decrease in current. If the current drops faster than this predicted rate, then additional heating due to a poor connection, an arc, hot spot, or other fault may be the cause. Firmware in microprocessor 66 then aborts the test by control of relay driver 78 when this condition is detected. Also, a fault condition indicated through user interface 68. Due to relationship between the test time and the branch impedance, the current needs to be sampled many times during the test. This is necessary in order to determine whether or not the current drop follows the above equation, which would indicate that the resistance change is due to normal resistive heating over the elapsed time.

Design Considerations for the "Arc Detect" Test Improvement

A simple method to accomplish arc detection would be to sample both the voltage and current sensors, and if significant energy above the fundamental power line frequency (60 Hz in the US) was detected, then the test would either not be performed (if in the qualification phase), or, if in the test phase, the test would be aborted. The firmware would determine the ratio of fundamental power line energy to high frequency energy, which is indicative of arcing. The ratio would be determined preferably using preset limits stored in the processor memory. Alternatively, arc detection can be accomplished by comparing the waveshape, or measurements of the waveshape, to a stored library of known arc signatures. This would also be done in the firmware of the microprocessor.

Another inventive concept is to implement arc detection as part of the circuit pre-qualification, using a small load (5 to 20 A). As described above, voltage sensor 50 and current sensor 74 provide the data necessary for firmware in microprocessor 66 to determine whether there was significant energy above the fundamental line frequency. If any arc was detected, the test would not be allowed to take place, and the user would be provided with a failure indication through interface 68. The same arc detection circuitry could also be used during the shorting test, and the test aborted should an arc be detected, in a manner similar to the current "droop" monitoring described above.

Other embodiments will occur to those skilled in the art and are within the scope of the following claims.

What is claimed is:

1. A circuit breaker test device for testing a circuit breaker and the branch circuit of which the circuit breaker is a part, the circuit breaker test device comprising:

first switch means for controllably short circuiting the branch circuit;

control means for causing the first switch means to short circuit the branch circuit, and for causing the first switch means to cease short circuiting the branch circuit after a test time; and means for determining an impedance value of the branch circuit, and enabling operation of the control means only if the impedance value is within predetermined limits;

means for measuring the current flowing in the branch circuit during the short circuit test; and wherein the control means is responsive to the means for measuring current, and causes the first switch means to cease short circuiting the branch circuit, upon the detection of a rate of current drop of greater than a predetermined rate.

2. The circuit breaker test device of claim 1, further comprising means for detecting arcing in the branch circuit during the short circuit test.

3. The circuit breaker test device of claim 2, further comprising means for measuring the voltage in the branch circuit.

4. The circuit breaker test device of claim 3, wherein the means for detecting arcing comprises means, responsive to the means for measuring current and the means for measuring voltage, for detecting energy above the fundamental power line frequency.

5. The circuit breaker test device of claim 4, wherein the means for detecting arcing further comprises means for determining the ratio of energy at the fundamental frequency to energy above the fundamental frequency.

6. A circuit breaker test device for testing a circuit breaker and the branch circuit of which the circuit breaker is a part, the circuit breaker test device comprising:

first switch means for controllably short circuiting the branch circuit;

control means for causing the first switch means to short circuit the branch circuit for a variable test time, and for causing the first switch means to cease short circuiting the branch circuit after the test time;

means for determining an impedance value of the branch circuit, and enabling operation of the control means only if the impedance value is within predetermined limits; and means, responsive to the means for determining an impedance value of the branch circuit, for automatically establishing the test time during which the control means causes the branch circuit short circuit based on the determined impedance value of the branch circuit.

7. A circuit breaker test device for testing a circuit breaker and the branch circuit of which the circuit breaker is a part, the circuit breaker test device comprising:

first switch means for controllably short circuiting the branch circuit;

control means for causing the first switch means to short circuit the branch circuit, and for causing the first switch means to cease short circuiting the branch circuit after a test time, wherein the test time is established in order to maintain a constant energy carried by the branch circuit during the short circuit test; and means for determining an impedance value of the branch circuit, and enabling operation of the control means only if the impedance value is within predetermined limits;

wherein the control means includes means for automatically setting the test time based on the impedance value of the branch circuit; and wherein the test time is established to be proportional to the determined impedance value of the branch circuit.

\* \* \* \* \*